(12) United States Patent
Sherman et al.

(10) Patent No.: US 10,229,832 B2
(45) Date of Patent: Mar. 12, 2019

(54) TECHNIQUES FOR FORMING PATTERNED FEATURES USING DIRECTIONAL IONS

(71) Applicant: Varian Semiconductor Equipment Associates, Inc., Gloucester, MA (US)

(72) Inventors: Steven R. Sherman, Newton, MA (US); John Hautala, Beverly, MA (US); Simon Ruffell, South Hamilton, MA (US)

(73) Assignee: VARIAN SEMICONDUCTOR EQUIPMENT ASSOCIATES, INC., Gloucester, MA (US)

( * ) Notice: Subject to any disclaimer, the term of this patent is extended or adjusted under 35 U.S.C. 154(b) by 113 days.

(21) Appl. No.: 15/384,496

(22) Filed: Dec. 20, 2016

(65) Prior Publication Data

US 2018/0082844 A1 Mar. 22, 2018

Related U.S. Application Data

(60) Provisional application No. 62/398,032, filed on Sep. 22, 2016.

(51) Int. Cl.
*B44C 1/22* (2006.01)
*H01L 21/263* (2006.01)
(Continued)

(52) U.S. Cl.
CPC ...... *H01L 21/2633* (2013.01); *H01L 21/3065* (2013.01); *H01L 21/31116* (2013.01);
(Continued)

(58) Field of Classification Search
CPC ........... H01L 21/2633; H01L 21/32317; H01L 21/76879; H01L 21/3065
(Continued)

(56) References Cited

U.S. PATENT DOCUMENTS

| 4,484,979 A | 11/1984 | Stocker |
| 4,680,085 A | 7/1987 | Vijan et al. |

(Continued)

FOREIGN PATENT DOCUMENTS

| JP | 09-120954 A | 5/1997 |
| JP | 2006054317 A | 2/2006 |

(Continued)

OTHER PUBLICATIONS

Jin-Kwan Lee et al., Oblique-Directional Plasma Etching of Si Using a Faraday Cage, Journal of the Electrochemical Society, 2009, D222-D225, 156 (7), The Electrochemical Society.
(Continued)

*Primary Examiner* — Binh X Tran

(57) ABSTRACT

A method of patterning a substrate. The method may include: providing a first surface feature and a second surface feature in a staggered configuration within a layer, the layer being disposed on the substrate, and directing first ions in a first exposure to a first side of the first surface feature and a first side of the second surface feature, in a presence of a reactive ambient containing a reactive species, wherein the first exposure etches the first side of the first surface feature and the first side of the second surface feature, wherein after the directing, the first surface feature and the second surface feature merge to form a third surface feature.

19 Claims, 8 Drawing Sheets

(51) Int. Cl.
*H01L 21/3065* (2006.01)
*H01L 21/311* (2006.01)
*H01L 21/768* (2006.01)
*H01L 21/3213* (2006.01)

(52) U.S. Cl.
CPC .. *H01L 21/32137* (2013.01); *H01L 21/76802* (2013.01); *H01L 21/76879* (2013.01)

(58) Field of Classification Search
USPC ................................ 216/66, 67, 71; 438/712
See application file for complete search history.

(56) References Cited

U.S. PATENT DOCUMENTS

| | | |
|---|---|---|
| 6,414,366 B1 | 7/2002 | Kamijima |
| 6,787,052 B1 | 9/2004 | Vaganov |
| 6,794,256 B1 | 9/2004 | Fuselier et al. |
| 7,767,977 B1 | 8/2010 | Godet et al. |
| 7,790,621 B2 | 9/2010 | Wen |
| 8,101,510 B2 | 1/2012 | Godet et al. |
| 8,268,684 B2 | 9/2012 | Chang et al. |
| 8,288,741 B1 | 10/2012 | Miller et al. |
| 8,339,752 B1 | 12/2012 | Hattori et al. |
| 9,153,478 B2 | 10/2015 | Liu et al. |
| 2006/0166419 A1 | 7/2006 | Shimoyama et al. |
| 2007/0051622 A1 | 3/2007 | Tang et al. |
| 2007/0063276 A1* | 3/2007 | Beintner ............... H01L 21/845 257/347 |
| 2008/0002749 A1 | 1/2008 | Scherer et al. |
| 2008/0019408 A1 | 1/2008 | Behfar |
| 2008/0233691 A1 | 9/2008 | Cheng et al. |
| 2009/0023098 A1 | 1/2009 | Jain et al. |
| 2009/0026543 A1* | 1/2009 | Yang ................... H01L 21/845 257/365 |
| 2009/0084757 A1 | 4/2009 | Erokhin et al. |
| 2009/0250430 A1 | 10/2009 | Zhang |
| 2010/0252531 A1 | 10/2010 | Godet et al. |
| 2011/0021027 A1 | 1/2011 | Johnson |
| 2011/0070531 A1* | 3/2011 | Iyanagi .................. G03F 1/36 430/5 |
| 2011/0114851 A1 | 5/2011 | Purser et al. |
| 2011/0151359 A1* | 6/2011 | Shieh ..................... G03F 1/36 430/5 |
| 2011/0248326 A1 | 10/2011 | Kanakasabapathy et al. |
| 2013/0174103 A1* | 7/2013 | Shieh .............. H01L 21/823431 716/54 |
| 2013/0295755 A1* | 11/2013 | Chang ............... H01L 21/76897 438/586 |
| 2013/0328157 A1 | 12/2013 | Cheng et al. |
| 2014/0017817 A1 | 1/2014 | Godet et al. |
| 2014/0080276 A1 | 3/2014 | Brand et al. |
| 2014/0091394 A1 | 4/2014 | Li et al. |
| 2014/0357080 A1 | 12/2014 | Lisi et al. |
| 2015/0072527 A1* | 3/2015 | Ng ..................... H01L 21/3086 438/696 |
| 2015/0083581 A1 | 3/2015 | Sherman et al. |
| 2015/0118604 A1 | 4/2015 | Dynes et al. |
| 2015/0311073 A1 | 10/2015 | Srinivasan et al. |

FOREIGN PATENT DOCUMENTS

| | | |
|---|---|---|
| JP | 5893172 B2 | 3/2016 |
| KR | 10-0585440 B1 | 6/2006 |
| KR | 1020060078440 A | 7/2006 |
| KR | 1020150015130 A | 2/2015 |
| WO | 0058953 A2 | 10/2000 |
| WO | 2014110379 A1 | 7/2014 |

OTHER PUBLICATIONS

Steve R. Sherman, et al., Replacement Metal Gate Transistor, U.S. Appl. No. 13/921,731, filed Jun. 19, 2013.
Steve R. Sherman, et al., Process Flow for Replacement Metal Gate Transistors, U.S. Appl. No. 13/921,717, filed Jun. 19, 2013.
International Search Report and Written Opinion dated Jan. 8, 2015 for PCT/US2014/057205 Filed Sep. 24, 2014.
International Search Report and Written Opinion dated Aug. 30, 2016 in corresponding international patent application No. PCT/US2016/035417.
Xin Sun, et al., Selective Enhancement of SiO2 Rate by Ar-Ion Implantation for Improved Etch Depth Control, Electrochemical and Solid-State Letters, 2007, pp. D89-D91, vol. 10, Issue 9, The Electrochemical Society.
R. Charvel et al., Etch Rate Modification of SiO2 by Ion Damage, Electrochemical and Solid State Letters, 2006, pp. G245-G247, vol. 9, Issue 7, The Electrochemical Society.
James C. North. et al., Tapered Windows in Phosphorus-Doped SiO2 by Ion Implantation, IEEE Transactions on Electron Devices, 1978, pp. 809-812, vol. ED-25, IEEE.
Avishai Ofan, et al., Origin of Highly Spatially Selective Etching in Deeply Implanted Complex Oxides, Applied Physics Letters, 2008, pp. 181906-1 to181906-3, vol. 93, On-line publishing.
International Search Report and Written Opinion dated Jun. 19, 2017 for PCT/US2017/020909 filed Mar. 6, 2017.
International Search Report and Written Opinion dated Dec. 26, 2017, for PCT/US2017/050958 filed Sep. 11, 2017.

* cited by examiner

TECHNIQUES FOR FORMING PATTERNED FEATURES USING DIRECTIONAL IONS

RELATED APPLICATIONS

This application claims priority to U.S. Provisional Patent Application No. 62/398,032, filed Sep. 22, 2016, entitled TECHNIQUES FOR FORMING PATTERNED FEATURES USING DIRECTIONAL IONS, and incorporated by reference herein in its entirety.

FIELD

The present embodiments relate to device processing techniques, and more particularly, to forming complex shapes in a layer during device fabrication.

BACKGROUND

As semiconductor devices continue to scale to smaller dimensions, the ability to pattern features becomes increasingly difficult. Present day photolithography tools may employ 193 nm wavelength light to pattern semiconductor devices, where the devices may have dimensions as small as 10 nm to 30 nm.

In addition to challenges for patterning relatively simpler shapes, such as lines, rectangular pads, circles, and the like, the ability to pattern complex structures faces more challenges. Due to optics limitations such as diffraction, etc., patterning features with well-defined edges and especially corners is difficult. For this reason many of the smallest patterns in present day technology are restricted to 1-dimension, i.e., lines and spaces, where such features run just along one direction. These features may be connected as designed using additional layer(s) located above the first layer, which additional layer may have lines and spaces running along a different direction. While this approach enables smaller patterns, the approach also limits the flexibility for circuit design.

In other examples, known features for forming electrical connection between two offset regions within a single device layer include an "L" shape, or a staggered shape, or other 2-dimensional shape. The capability for printing such shapes using conventional lithographic techniques is limited. Even advanced optical proximity correction (OPC) techniques for optical lithography may not adequately print such shapes. In one instance, a staggered structure designed to have straight edges may instead have a rounded shape after lithographic processing. This rounding may result in the generation of a smaller area than the original design for other features to land on, and may additionally cause overlay margin errors where subsequently deposited material, such as a metal feature, overlaps in an unwanted fashion with another metal feature. This rounding is especially prevalent when the dimensions of the pattern are approximately 20 nm or less.

Accordingly, while the ability to generate small 2-dimensional patterns provides greater design flexibility, processes to accomplish this patterning are lacking, especially for defining patterned features below 50 nm in size.

With respect to these and other considerations the present disclosure is provided.

BRIEF SUMMARY

In one embodiment, a method of patterning a substrate may include providing a first surface feature and a second surface feature in a staggered configuration within a layer, the layer being disposed on the substrate. The method may also include directing first ions in a first exposure to a first side of the first surface feature and a first side of the second surface feature, in a presence of a reactive ambient containing a reactive species, wherein the first exposure etches the first side of the first surface feature and the first side of the second surface feature. After the directing, the first surface feature and the second surface feature may merge to form a third surface feature.

In another embodiment, a method of patterning a layer disposed on a substrate, may include providing a first surface feature and a second surface feature within the layer in a staggered configuration. The method may further include subjecting the first surface feature and the second surface feature to an exposure. The exposure may include directing, in a presence of a reactive ambient containing a reactive species, first ions to a first side of the first surface feature and to a first side of the second surface feature; and concurrently directing second ions to a second side of the first surface feature and to a second side of the second surface feature. The exposure may etch the first side of the first surface feature and the first side of the second surface feature, and etch the second side of the first surface feature and the second side of the second surface feature. After the directing, the first surface feature and the second surface feature may merge to form a third surface feature.

In a further embodiment, a method of forming a device structure, may include providing a first surface feature and a second surface feature in a staggered configuration within a first layer, the first layer being disposed on a substrate. The method may also include directing first ions in an exposure to a first side of the first surface feature and to a first side of the second surface feature, in a presence of a reactive ambient containing a reactive species. The first exposure may etch the first side of the first surface feature and the second surface feature, wherein after the directing, the first surface feature and the second surface feature merge to form a third surface feature, where the third feature comprises a recess. The method may further include filling the third surface feature with a conductive material.

DETAILED DESCRIPTION

Figure 1A:
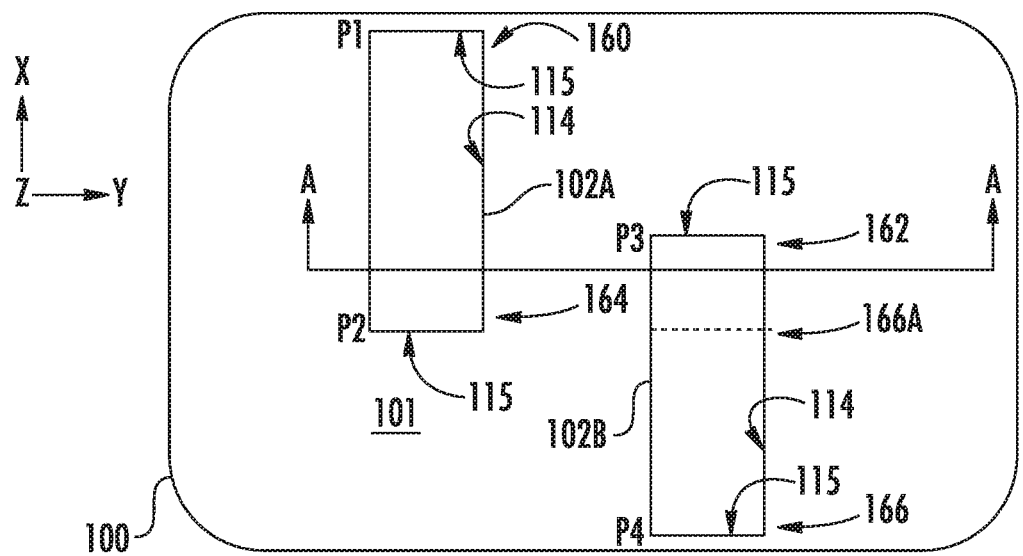
FIGS. 1A-1C depict a top plan view of various operations involved for forming a surface feature according to various embodiments of the disclosure.

The present embodiments will now be described more fully hereinafter with reference to the accompanying drawings, where some embodiments are shown. The subject matter of the present disclosure may be embodied in many different forms and are not to be construed as limited to the embodiments set forth herein. These embodiments are provided so this disclosure will be thorough and complete, and will fully convey the scope of the subject matter to those skilled in the art. In the drawings, like numbers refer to like elements throughout.

The present embodiments provide novel techniques to pattern substrates and in particular novel techniques to form a feature disposed on a substrate such as a surface feature. As used herein the term "substrate" may refer to an entity such as a semiconductor wafer, insulating wafer, ceramic, as well as any layers or structures disposed thereon. As such, a surface feature, layer, series of layers, or other entity may be deemed to be disposed on a substrate, where the substrate may represent a combination of structures, such as a silicon wafer, oxide layer, and so forth. Additionally, the term "patterning a substrate" may be understood to include patterning a layer or layers disposed on the substrate, including patterning surface features within a layer disposed on the substrate.

In various embodiments, the surface feature may be used for any purpose, including providing connections between other features, patterning a layer disposed underneath the surface feature, or other purpose. Examples of a surface feature include what is referred to herein as a complex 2-dimensional feature, or "complex 2-D feature." In various embodiments, the complex 2-D feature may have a complex 2-D shape as described below, where the smallest dimension of the complex 2-D feature is less than 100 nm, and in some cases is less than 30 nm. In various embodiments, the complex 2-D feature may be a recess formed within a substrate or formed within a layer disposed on other layers within a substrate. Examples of a complex 2-D feature shape include an L-shape, a capital T-shape, a small t-shape, a zig-zag shape, or other shape, such as the shapes disclosed herein with respect to the figures. An example of a simple shape includes a line, circle, square, rectangle or other simple shape. In various embodiments, techniques and apparatus are provided to generate a recess having a complex 2-D shape having sharply defined corners, among other features.

Figure 1B:
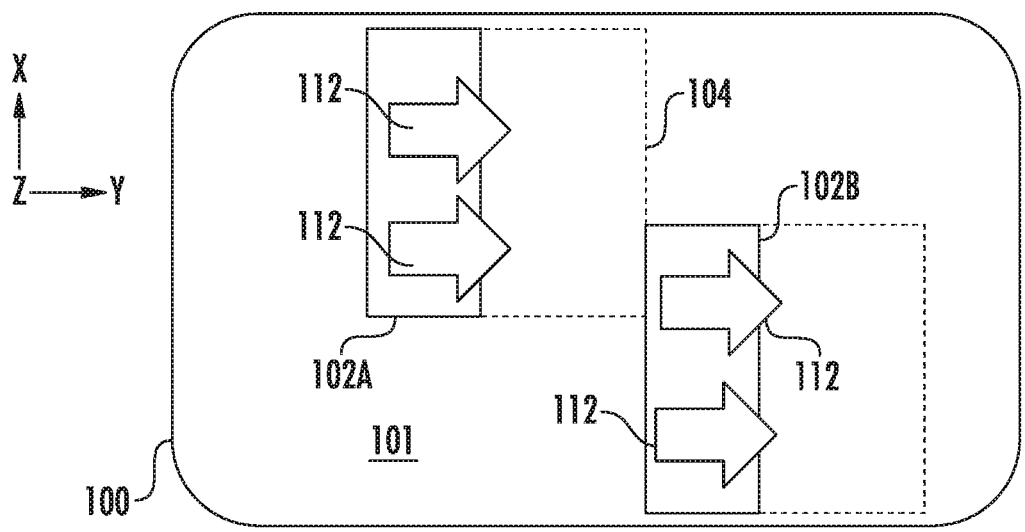
Figure 1C:
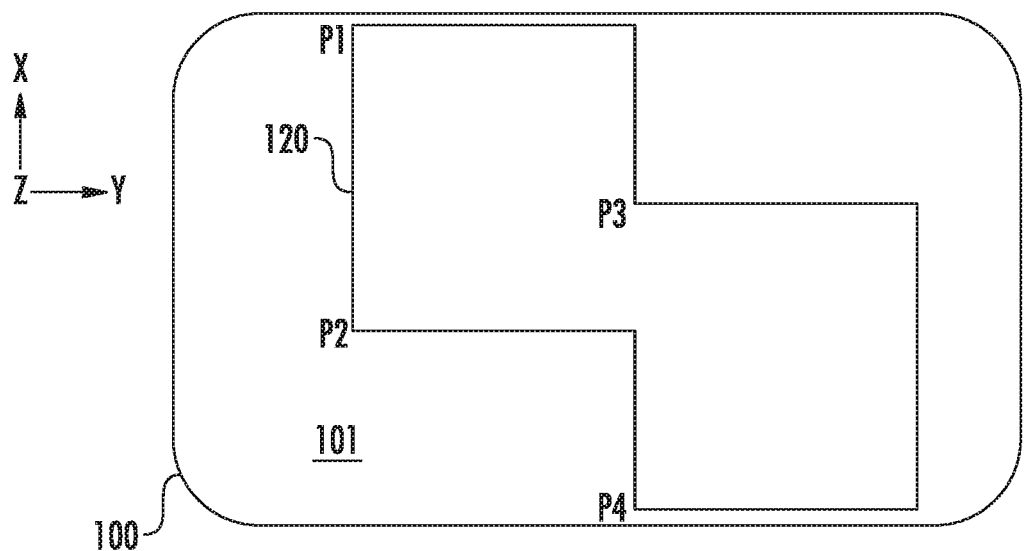
Figure 1D:
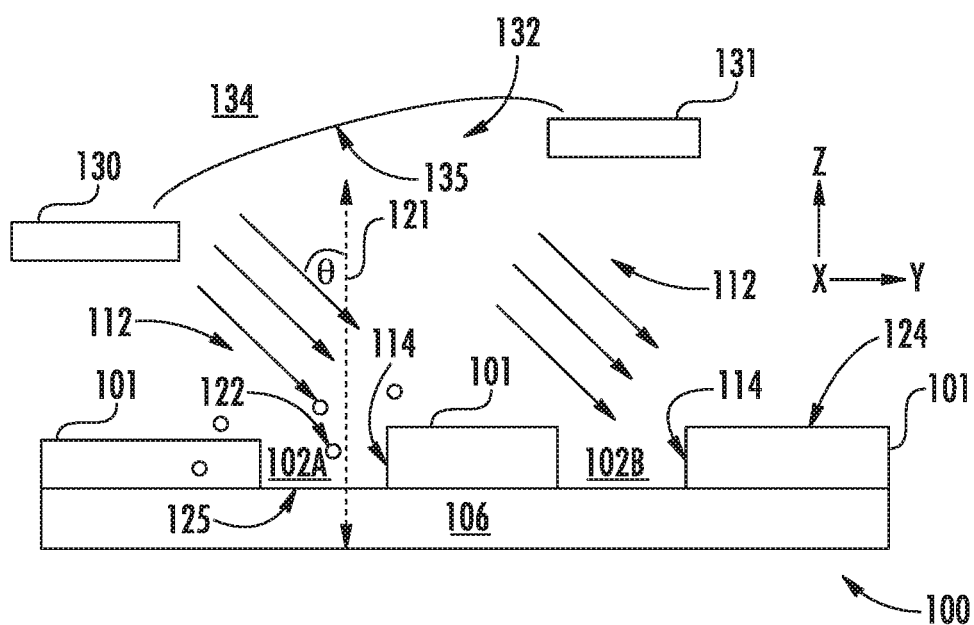
FIGS. 1D-1E depict a side view of the operations of FIGS. 1B-1C.
Figure 1E:
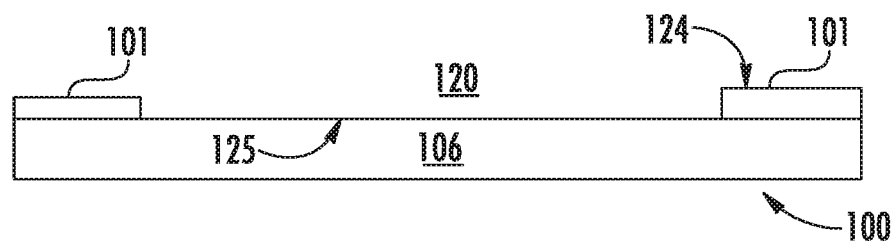

Turning now to the figures, FIGS. 1A-1C depict a top plan view of various operations involved for forming a surface feature according to various embodiments of the disclosure. FIGS. 1D-1E depict a side cross-sectional view of the operations of FIGS. 1B-1C, shown along the section A-A of FIG. 1A. The device structure (not explicitly shown) may be formed in a substrate 100, where the substrate 100 may represent any number of layers and other features. The device structure may be formed from a surface feature to be formed in a layer of the substrate 100, in this case, shown as layer 101. For example, in accordance with the present embodiments, and as shown in FIG. 1C, a recessed structure shown as surface feature 120 may be formed in the layer 101. The surface feature 120 may be characterized as having a zig-zag shape made from two rectangles adjacent one another along a portion of a common edge, where the rectangles are also offset from one another along one direction. Such a surface feature may be used, for example, as a complex electrical interconnect, by filling in the surface feature 120 with a conductive material.

Figure 1F:
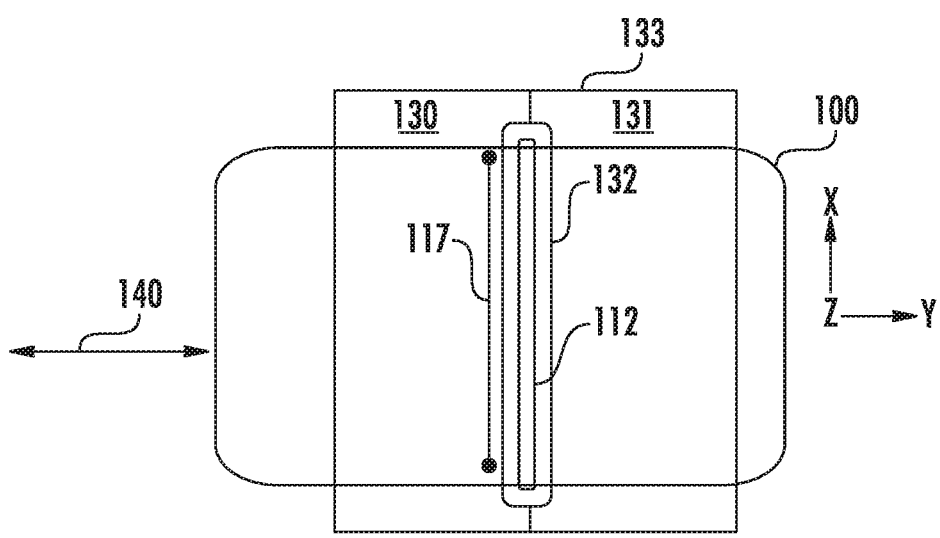
FIG. 1F depicts a top plan view of an extraction assembly in accordance with embodiments of the disclosure.
Figure 1G:
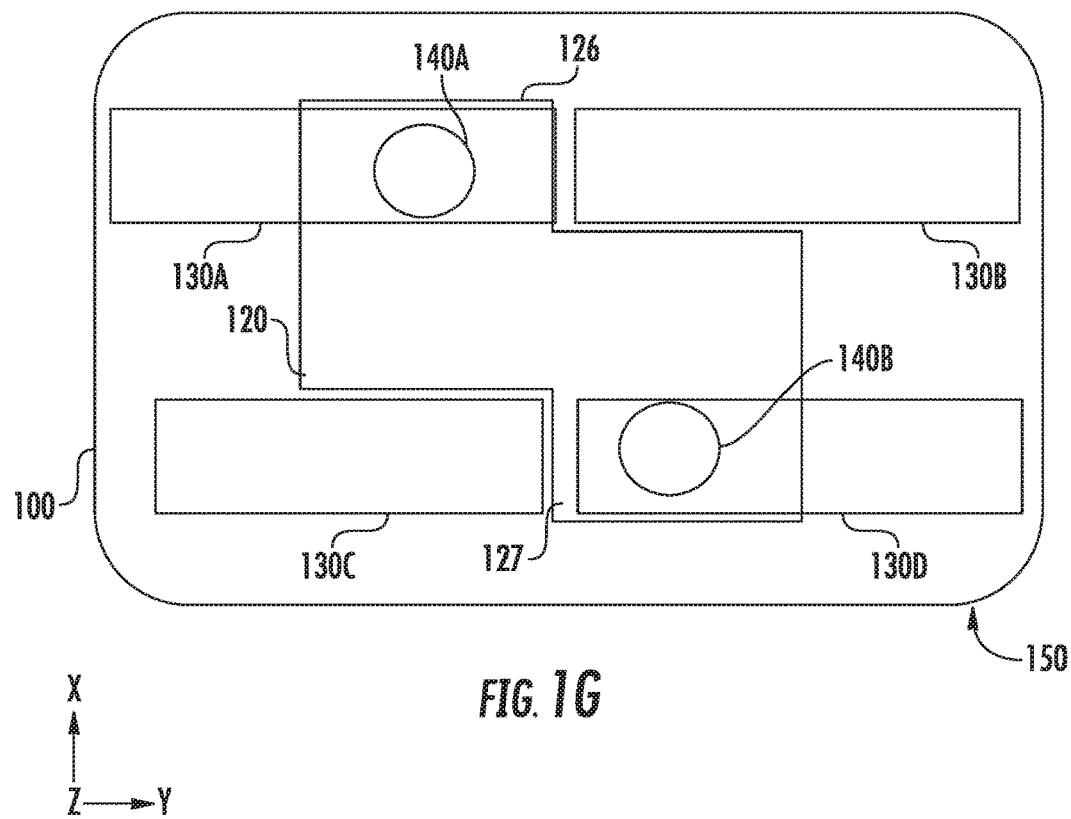
FIG. 1G depicts a top plan view of a device structure formed in accordance with embodiments of the disclosure.

FIG. 1G depicts a top plan view of a device structure 150 formed in accordance with embodiments of the disclosure. In this example, the surface feature 120 may be filled with an electrically conductive material, shown as material 127, forming an interconnect 126, where the interconnect 126 has a complex 2-D shape of the surface feature 120. As shown, the interconnect 126 may serve to electrically connect a metal line 130A to another metal line 130D, where the metal line 130A and metal line 130D may be formed in a different layer or level of the device structure 150, as known in the art. In particular, a conductive via 140A and a conductive via 140B may be formed along the Z-axis of the Cartesian coordinate system as shown to join different portions of the interconnect 126 to metal line 130A and metal line 130D, respectively. At the same time, by forming a well-defined shape having sharp angles, the interconnect 126 may be placed in a manner where no conductive material overlaps the metal line 130C or metal line 130B. This placement may be advantageous when the metal lines are formed in the same level as the interconnect 126 or when the separation between the level of the interconnect 126 and the level containing the metal lines is small. By avoiding overlap, potential shorting paths through a layer or unwanted electric fields or other undesirable effects may be avoided.

Returning to FIG. 1A, there is shown a first instance where a surface feature 102A and a surface feature 102B are formed in the layer 101. As noted the surface feature 102A and surface feature 102B may be a recessed feature formed within the layer 101, as shown also in FIG. 1D. The surface feature 102A and surface feature 102B may be formed according to known lithography and etching techniques, for example. The surface feature 102A and surface feature 102B may have a simple rectangular shape where the simple rectangular shape may be printed in a suitable lithographic medium and in some cases transferred into another layer, such as the layer 101. While not limiting, in various embodiments the layer 101 may be a known SiOC (silicon-oxygen-carbon) material or known SiON (silicon-oxygen-nitrogen) material, a silicon material, including amorphous silicon, a known oxide such as a TEOS (tetraethyl orthosilicate) oxide, or other material. Moreover, a first material of an underlying layer of substrate 100, shown as layer 106, may be a different material than a second material of layer 101. For example, the layer 106 may be a known silicon oxide, silicon nitride, titanium nitride, silicon, or other material. The embodiments are not limited in this context.

Because the surface feature 102A and surface feature 102B have a simple shape, these features may be formed faithfully using known lithographic techniques according to a designed shape. Such simple shapes include a simple rectangle, where the rectangle may be formed faithfully even at dimensions as small as 10 nm to 30 nm in the direction of the smallest dimension, such as along the Y-axis.

As shown in FIG. 1A, the first surface feature, surface feature 102A, and the second surface feature, surface feature 102B, form a staggered configuration, described in more detail below. In brief, a staggered configuration refers to the situation where at least one end of a first surface feature is offset along a first axis, with respect to at least one end of a second surface feature. This situation is particularly depicted where the top end 160 of surface feature 102A is offset along the X-axis with respect to the top end 162 of surface feature 102B. In addition, in the particular example of FIG. 1A, the bottom end 164 of surface feature 102A is offset with respect to the bottom end 166 of the surface feature 102B. This staggered configuration of different surface features may be harnessed using novel etching processes to form complex 2-D features as detailed below. A configuration where two different surface features have two opposite ends mutually aligned with one another along a given axis does not constitute a "staggered configuration" as used herein. For example, when top end 160 is aligned with top end 162 along the X-axis and bottom end 164 is aligned with bottom end 166 along the X-axis, the resulting configuration is not a staggered configuration. Notably, in embodiments where the surface feature 102B is shorter than the surface feature 102A, and where the top end 160 is not aligned with the top end 162, while the bottom end 164 is aligned with the bottom end 166A, this latter configuration may also be deemed a staggered configuration.

As further shown in FIG. 1A, the second surface feature, surface feature 102B is offset from the first surface feature, surface feature 102A within the substrate plane (X-Y) plane along a second axis, represented by the Y-axis. In particular, the offset of surface feature 102A from surface feature 102B may be explained in the following manner. The first surface feature, surface feature 102A, may extend from a first position P1 to a second position P2 along a first axis, shown as the X-axis. In accordance with various embodiments, the distance between P1 and P2 may be preserved, at least in a part of the resulting surface feature, after processing is completed to form the surface feature 120, shown in FIG. 1C. As further shown in FIG. 1A, the second surface feature, surface feature 102B, may extend from a third position P3 to a fourth position P4 along the first axis, shown as the X-axis. In accordance with various embodiments, the distance between P3 and P4 may also be preserved, at least in a portion of the resulting surface feature, after processing is completed to form the surface feature 120, shown in FIG. 1C. In addition, at least one position P1 or P2, representing opposite ends of the surface feature 102A along the X-axis, may be offset from a corresponding position, P3 or P4, in the surface feature 102B. In this manner, an offset is provided along the X-axis between at least one end of the surface feature 102A and the surface feature 102B. As detailed below, this offset may be harnessed using the novel techniques of the present embodiments to fabricate a complex 2-D shape, as described above.

Notably, the surface feature 102A and the surface feature 102B are isolated from one another, meaning there is material of the layer 101 disposed between the surface feature 102A and surface feature 102B. In particular, the surface feature 102A is also displaced from or offset from the surface feature 102B along the Y-axis. For example, the surface feature 102A and surface feature 102A may be printed as line segments, where the spacing between line segments along the Y-axis is equal to the width of the line segments along the Y-axis. The embodiments are not limited in this context. Formation of such a line/spacing pattern is well within the capability of fabrication using known lithographic techniques, for dimensions ranging down to 10 nm to 30 nm.

Turning now to FIG. 1B and FIG. 1D there is shown a subsequent operation where the surface feature 102A and surface feature 102B are subject to a first exposure, where the first exposure generates etching of the material of layer 101. In particular, referring to FIG. 1B and FIG. 1D, the first exposure involves directing first ions, shown as ions 112, to the surface feature 102A and the surface feature 102B as directional ions, an in particular, in a unidirectional manner, where the details of the geometry are described below. In brief, by providing the ions 112 as unidirectional ions in the presence of a reactive ambient, shown as reactive species 122, the first exposure has the effect of etching the surface feature 102A and the surface feature 102B to merge to form a third surface feature. In this case, the target or design shape for the third surface feature is a complex 2-D feature having a complex shape, shown as design shape 104 in FIG. 1B, and as represented by the final processed feature, surface feature 120, in FIG. 1C. In particular, the ions 112 are directed to a first surface of the surface feature 102A, represented by side 114, while the ions 112 are also directed to a first surface of the surface feature 102B, also shown as the side 114.

In detail, the ion trajectory of ions 112 is generally represented by the direction of the unidirectional arrows in the figures. As viewed in the top plan view of FIG. 1A, the ion trajectory of ions 112 may extend along a first direction, where a projection of the ion trajectory of ions 112 within the substrate plane (the X-Y plane) is parallel to the Y-axis. Thus, the ions 112 in top plan view appear to travel parallel to the Y-axis. As shown in FIG. 1D, the ion trajectory of ions 112 may form a non-zero angle of incidence, shown as $\theta$, with respect to a perpendicular 121 to the substrate plane, the X-Y plane, where the perpendicular 121 in this case extends along the Z-axis. Notably the value of $\theta$ may be greater than zero and less than 90 degrees. In particular embodiments, the non-zero angle of incidence may be between 15 degrees and 75 degrees, depending on the width of a surface feature 120 along the Y-axis and the height of the surface feature 120 along the Z-axis.

As further shown in FIG. 1A, the trajectory of ions 112 in plan view extends parallel to the sides 115, where sides 115 form the ends of the surface feature 102A and surface feature 102B along the X-axis. Accordingly, the ions 112 may not impact the sides 115. In this manner, this unidirectional process may result in the selective etching of the side 114 while not etching the sides 115. This selective etching may generate the final structure, surface feature 120, where the dimensions and position of the surface feature 102A and surface feature 102B are preserved along the X-axis, while at the same time the surface feature 102A and surface feature 102B merge into one complex feature as shown. The present inventors have successfully performed unidirectional etching of surface features having initial dimensions between 20 nm to 100 nm in a first direction within a plane. In particular, for such features, etching of material along the first direction was accomplished to increase the dimensions of the surface feature by 1 nm to 40 nm along the first direction, while no appreciable material was observed along a second direction, perpendicular to the first direction. Accordingly, referring again to FIG. 1C, since etching along the X-axis is avoided, etching along just the Y-axis to form surface feature 120 results in the preservation of the positions (P1, P2, P3, and P4) of the edges of the surface feature 102A and surface feature 102B along the X-axis. Said differently, when a first surface feature and a second surface feature are etched to form a third surface feature, the third surface feature may preserve the positions of certain edges of the first surface feature and the second surface feature. In particular, the complex 2-D feature, surface feature 120, has a set of edges located along the X-axis at the same positions, P1, P2, P3, and P4, of the surface features used to form the surface feature 120.

Figure 1H:
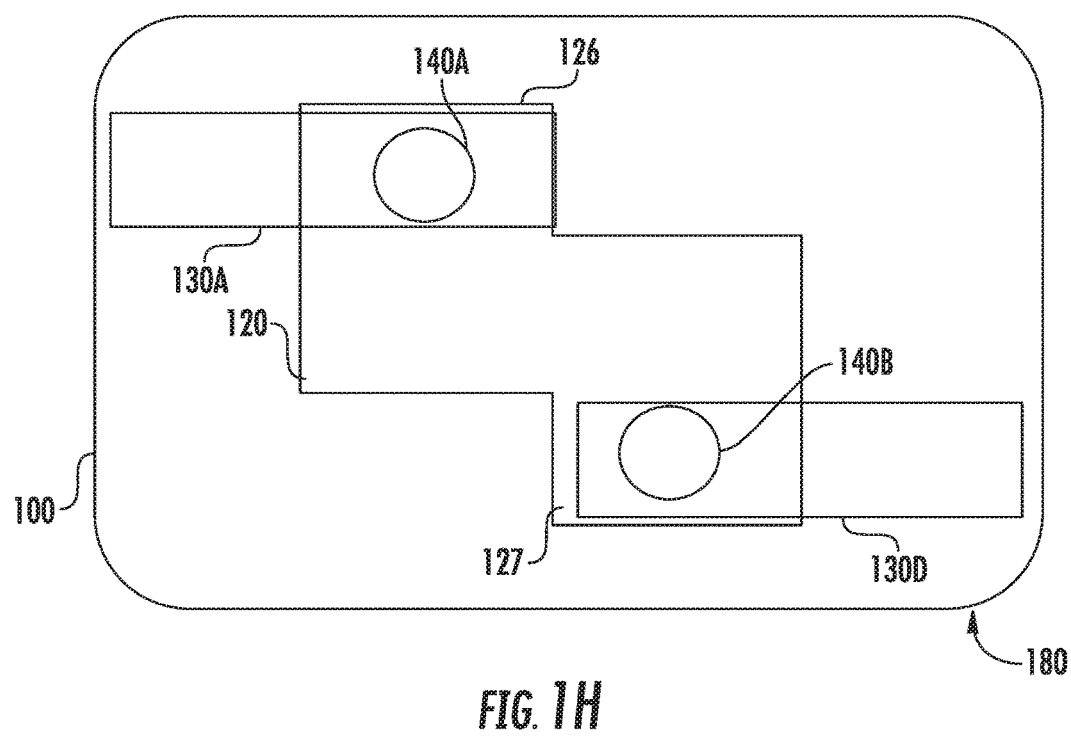
FIG. 1H depicts a top plan view of another device structure formed in accordance with embodiments of the disclosure.

Turning to FIG. 1H there is shown a top plan view of another device structure, device structure 180, formed in accordance with embodiments of the disclosure. This geometry is generally reflected in the arrangement shown in FIG. 1G when the metal line 130B and 130C are not present. In the geometry of FIG. 1H, as well as in various additional embodiments for forming a device structure, after a first surface feature and a second surface feature are etched to form a third surface feature in a first layer, a second layer may be formed. The second layer may be disposed above the first layer and may include at least two electrically conductive lines. In one particular embodiment, a first metal line, such as metal line 130A, and second metal line, such as metal line 130B, may be formed in the second layer, in a manner wherein the third surface feature overlaps the first metal line and second metal line, as shown in FIG. 1H. These embodiments accordingly, may provide precise alignment of a complex 2-D feature disposed in a first layer with a plurality of lines disposed in a second layer, where the lines in the second layer are staggered from one another.

As shown in FIG. 1D, and in accordance with various embodiments, the ions 112 may be directed to the surface feature 102A and surface feature 102B in the presence of a reactive species, shown as the reactive species 122, and illustrated by the black dots. The ions 112 and reactive species 122 may be provided by a suitable apparatus capable of providing reactive species to the substrate as well as a concurrent beam of ions. Examples of such apparatus include plasma based apparatus having an extraction system extracting ions through an extraction aperture and directing the ions to a substrate. FIG. 1D and FIG. 1F illustrate an example of an extraction assembly 133, including an extraction aperture 132 for extracting the ions 112 from a plasma 134. The plasma 134 may be formed in a plasma chamber adjacent the extraction assembly 133, where the plasma 134 is formed by any known technique.

The angle of incidence of the ions 112 with respect to the perpendicular 121, θ, may be controlled by controlling parameters of a plasma system as is known, including plasma power, gas pressure, aperture size, and displacement between different portions of the extraction plate, among other factors. In some examples ions may be extracted having trajectories parallel to one another or differ among themselves by +/−5 degrees. This geometry allows the ions 112 to be directed as a parallel beam of ions along a target direction. In the example of FIG. 1A, the extraction assembly may include a plate 130 and a plate 131, where the plate 130 and plate 131 are offset from one another along the Z-axis. This geometry may tend to form a plasma meniscus oriented in a manner generating the ions 112, where the ions 112 when exiting the plasma 134 are directed along the trajectories shown by the arrows. The plate 130 and plate 131 may join one another and may define the extraction aperture 132, as shown in the plan view of FIG. 1F. In other embodiments, a single plate may include an aperture directing the ions 112 to the substrate 100 generally as shown.

FIG. 1F in particular illustrates a variant of the extraction assembly 133. In this variant, the extraction aperture 132 is elongated along the second direction parallel to the X-axis, meaning the dimension of the extraction aperture 132 along the X-axis is larger than the dimension of the extraction aperture 132 along the Y-axis. In some examples, the dimension of the extraction aperture 132 along the X-axis may be greater than 100 mm, while the dimension of the extraction aperture 132 along the Y-axis is less than 30 mm, and may be as narrow as 1 mm to 3 mm. The embodiments are not limited in this context. The ions 112 may accordingly form a ribbon beam having a high degree of uniformity along the X-axis, where the trajectories of ions 112 have a high degree of alignment along the Y-axis as shown. In other words, the ions 112 may form a ribbon beam having a long axis 117 parallel to a first axis (X-axis) a short axis parallel to a second axis (Y-axis) and, where the second axis is perpendicular to the first axis. By scanning the substrate 100 along the direction 140 with respect to the extraction aperture 132, a large portion or an entirety of the substrate 100 may be exposed to the ribbon beam, in other words, to ions 112.

Additionally, reactive species 122 may be provided directly to the substrate 100 or through extraction aperture 132 as neutrals, ions, radicals, or a combination of neutrals, ions, and radicals. Ions 112 themselves may be inert ions, such as argon, krypton, neon, and the like, or may include reactive species. The combination of ions 112 and reactive species 122 may include known recipes for performing reactive ion etching of materials including silicon oxide layers, SiON layers, SiOC layers, silicon nitride layers, silicon layers, carbon layers, and other materials systems. The embodiments are not limited in this context.

When ions 112 are used in conjunction with reactive species 122, where the reactive species are designed to promote reactive ion etching, this configuration enables a novel "one dimensional reactive ion etching" process. The one dimensional reactive ion etching process involves restricting the reactive ion etching to targeted features on a substrate surface while not affecting other features. The one dimensional reactive ion etching may differ from conventional reactive ion etching where ions directed may etch material along the vertical direction as well as along more than one direction within a plane of the substrate perpendicular to the vertical direction. For example, in conventional reactive ion etching, such as ashing of via structures formed within a layer the diameter of via structures may be increased in a non-selective manner along an X-direction and Y-direction.

In the example of FIG. 1B and FIG. 1D, as noted above, the etching may take place on select surfaces of the surface features provided in the layer 101. Additionally, because the ions 112 and reactive species 122 form an ambient for reactive ion etching, the etching shown in FIGS. 1B and FIG. 1D is not just selective as to different surfaces of the surface feature 102A and surface feature 102B, and is also selective with respect to surfaces of other material. In particular, at least some of the reactive species 122 may be neutrals. As such, the reactive species may pass through the extraction aperture 132 while not having a particular directionality, and may impinge upon various surfaces of the layer 101, as well as the exposed surfaces 125 of layer 106 within the surface feature 102A and surface feature 102B. As discussed above, and in accordance with various embodiments, the ions 112 may be restricted to impinging on the sides 114, while not impinging on the sides 115. Additionally, the ions 112 may impinge upon the top surface 124 of layer 101. As regards exposed surface 125, the ions 112 and reactive species 122 may be designed to selectively etch material of the layer 101 with respect to the material of layer 106, meaning the etch rate of material of layer 101 is greater than the etch rate of layer 106. In one particular example, layer 106 may be silicon oxide and layer 101 may be silicon nitride. Accordingly, while ions 112 and reactive species 122 may impinge upon exposed surface 125, little or no etching of layer 106 within surface feature 102A or surface feature 102B may take place in the scenario of FIG. 1B and FIG. 1D. Accordingly, after a first exposure to the ions 112 as illustrated in FIGS. 1B and 1D, the material of layer 101 is etched in a manner to generate the surface feature 120, while the exposed surface 125 remains unetched. Notably, because the top surface 124 of layer 101 is impacted by ions 112 as well as reactive species 122, the thickness of the layer 101 may also be reduced, since the combination of ions 112 and reactive species 122 is designed to selectively etch material of layer 101. The relative etch rate of layer 101 parallel to the Z-axis with respect to the etch rate along the Y-axis may be controlled by adjusting the value of θ, for example. Additionally, the layer 101 may be provided with an adequate initial thickness along the Z-axis so material of layer 101 remains after the etch process to form surface feature 120 is finished, as shown in FIG. 1E. Thus, loss of thickness of layer 101 during the exposure to ions 112 may be acceptable, to the extent adequate thickness remains to form a structure within the surface feature 120, or to pattern underlying layers, such as layer 106, in subsequent processing, as the case may be. Additionally, because material of layer 101 is removed by a reactive ion etching process, the material of layer 101 once etched may remain volatilized and may not redeposit on other surfaces of the device structure 150, rendering a clean and accurate shape for the device structure 150, as shown in FIG. 1G.

Figure 2A:
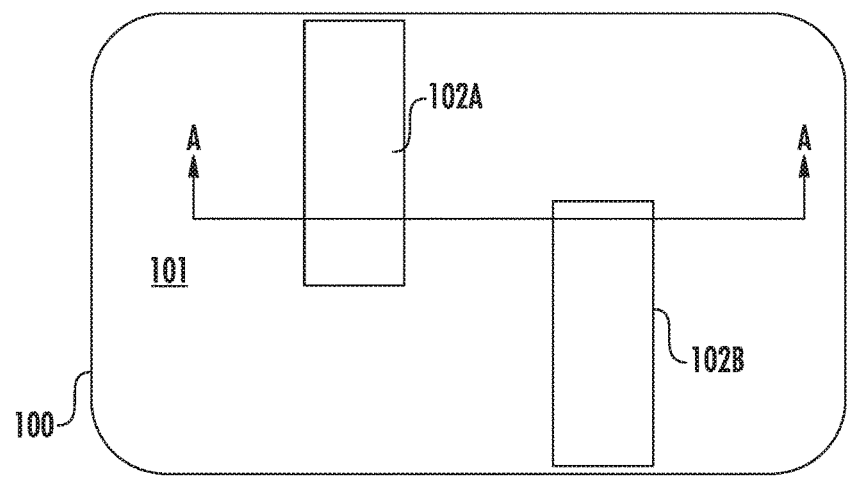
FIGS. 2A-2C depict a top plan view of various operations involved for forming a surface feature according to various additional embodiments of the disclosure.
Figure 2B:
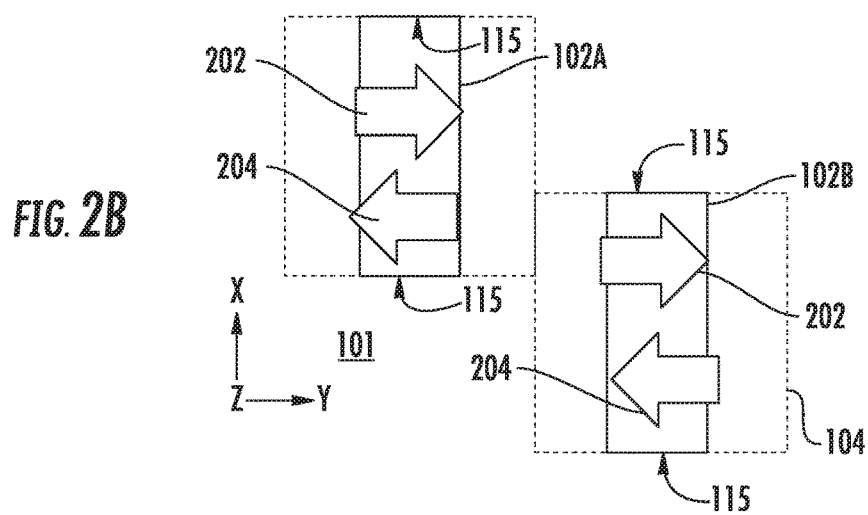
Figure 2C:
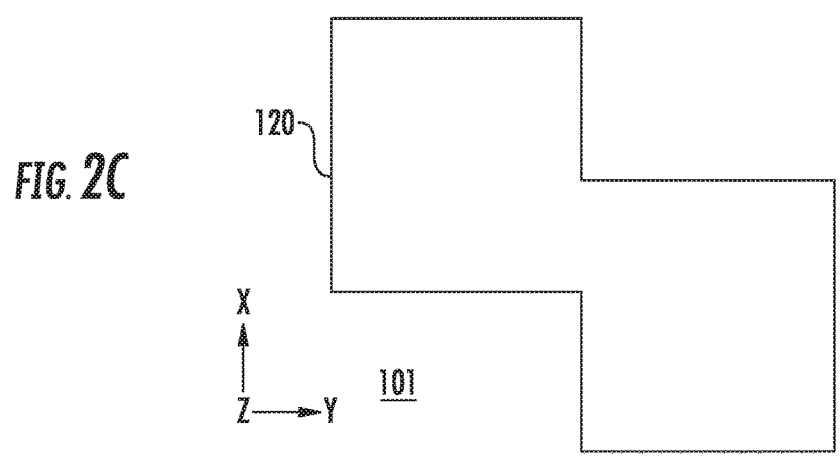
Figure 2D:
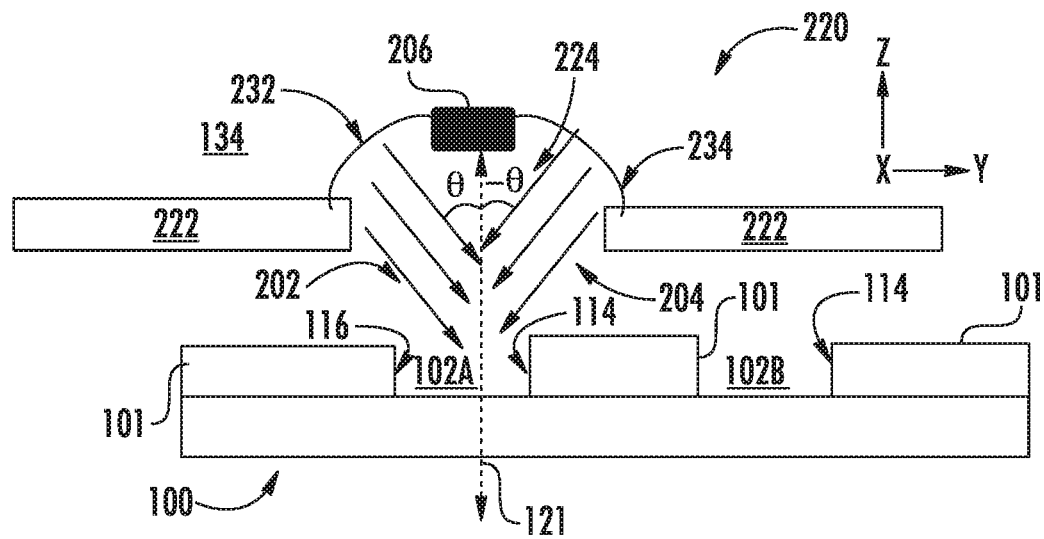
FIG. 2D depicts a side view of the operation of FIG. 2B.
Figure 2E:
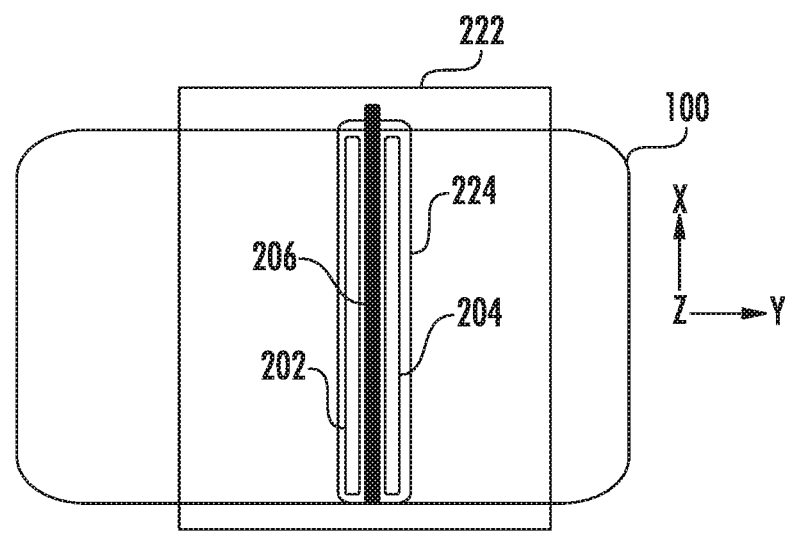
FIG. 2E depicts a top plan view of an extraction assembly in accordance with other embodiments of the disclosure.

FIGS. 2A-2C depict a top plan view of various operations involved for forming a surface feature according to various additional embodiments of the disclosure. FIG. 2D depicts a side view of the operation of FIG. 2B, shown along the section A-A of FIG. 2A. FIG. 2D and FIG. 2E also depict a cross-sectional view and top plan view, respectively, of an extraction assembly in accordance with other embodiments of the disclosure. Turning to FIG. 2A, an initial configuration of surface features may be provided in a substrate 100 as described above with respect to FIG. 1A. Turning to FIG. 2B and FIG. 2D there is shown a subsequent processing operation or set of processing operations, where ions 202 and ions 204 are directed to side 114 and side 116 of the surface feature 102A and surface feature 102B. At the same time, the trajectories of ions 202 and ions 204 may be arranged so as not to impact the sides 115, as shown. In this manner, etching of the surface feature 102A and surface feature 102B may proceed generally as described above with respect to FIG. 1B and FIG. 1D, with a difference being in the geometry of the etching taking place along the Y-axis, in this case toward the right and toward the left.

As shown in FIG. 2D in particular, an extraction assembly 220 may be used to perform the operation of FIG. 2B, where the extraction assembly 220 includes a planar extraction plate, shown as extraction plate 222, and includes a planar aperture, shown as extraction aperture 224. The extraction assembly 220 may further include a beam blocker 206, where the beam blocker 206 is disposed within the region above extraction aperture 224, and may have an elongated shape, as shown in FIG. 2D. In this manner, the beam blocker 206 and extraction aperture 224 may generate a pair of plasma menisci, shown as meniscus 232 and meniscus 234, which menisci, in turn, generate the ions 202 and ions 204, respectively, as a pair of ribbon ion beams. Notably, the ions 202 and ions 204 are generated concurrently, so the substrate 100 is etched by ions 202 and ions 204 at the same time.

In this manner, one dimensional reactive ion etching is performed using a pair of concurrent ion beams having ion trajectories whose projections within the X-Y plane are parallel to a common axis, such as the Y-axis. As further shown in FIG. 2D a first ion beam and second ion beam, as represented by ions 202 and ions 204, may form a mirror image about the X-Z plane so the ions 202 and ions 204 concurrently strike the opposing sides, sides 114 and sides 116.

In particular, while the ions 202 may have the properties and trajectories extending along a first direction as described above for ions 112, the second ions, ions 204, may have a second ion trajectory. In this case, the second ion trajectory extends along a second direction, shown by the arrows in FIG. 2B and FIG. 2D. The projection of the second direction within the substrate plane (X-Y plane) of the second ion trajectory may also be parallel to the Y-axis as shown in FIG. 2B. The second ion trajectory of ions 204, and may also form a non-zero angle of incidence with respect to the perpendicular 121, shown as −θ. The second direction of ions 204 may be deemed to be opposite the first direction of ions 202, meaning, for example, the projection of the trajectory of ions 204 in the X-Y plane is opposite the projection of the trajectory of ions 202 in the X-Y plane, as illustrated in FIG. 2B. According to some embodiments, the value of θ may be equal to the value of −θ.

The final structure produced in accordance with the operation of FIG. 2B and FIG. 2D may be similar to or the same as the structure of FIG. 1C, in this case also shown as surface feature 120. While in the embodiment particularly shown in FIG. 2D ions 202 and ions 204 are directed in a single exposure concurrently at the substrate 100, in other embodiments the ions 202 and ions 204 may be directed in succession in separate operations to the substrate 100. In various embodiments, first ions may be directed at a first side of the first surface feature and first side of the second surface feature in a first exposure, while the substrate is rotated about a perpendicular to the substrate plane after the first exposure. Subsequently, in a second exposure, second ions may be directed to a second side of the first surface feature and a second side of the second surface feature, in the presence of the reactive ambient containing the reactive species. In this manner, a combination of the first exposure and the second exposure may be used to form the third surface feature, as represented by the surface feature 120. For example, the ions 202 may be directed to first sides, sides 114 of substrate 100 using the extraction assembly 133 in a first exposure. Subsequently, the ions 204 may be directed to second sides, sides 116, in a second exposure using the extraction assembly 133, by rotating the substrate 180 degrees within the X-Y plane between the first exposure and second exposure.

Figure 3A:
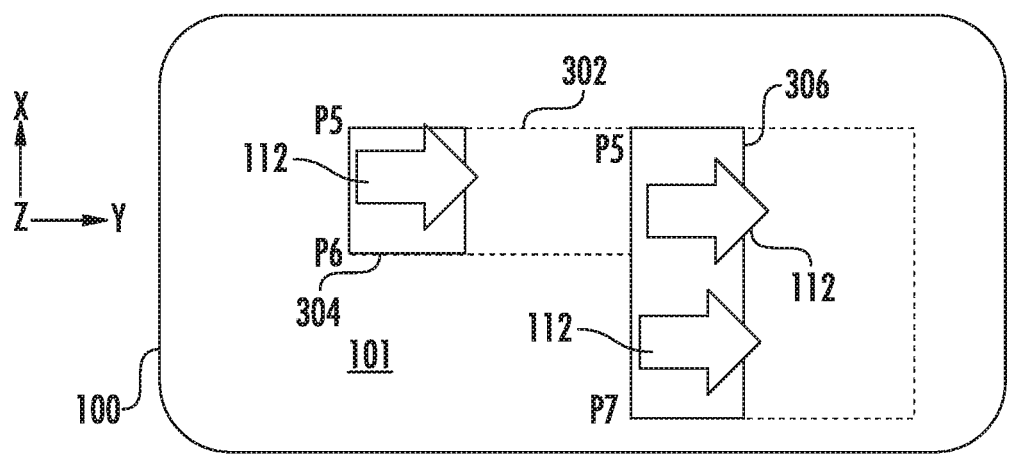
FIGS. 3A-3B depict a top plan view of various operations for processing of a device structure according to other embodiments of the disclosure.
Figure 3B:
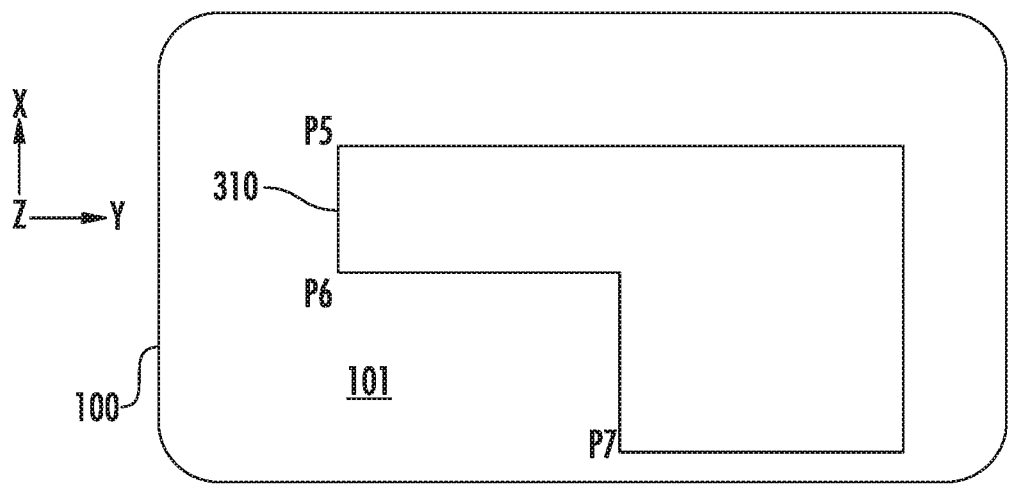

While the above embodiments illustrate formation of a final 2-dimensional surface feature having a staggered or zig-zag shape, the present embodiments may be used to form surface features having many other types of shapes. FIGS. 3A-3B depict a top plan view of various operations for processing of a device structure according to other embodiments of the disclosure, where a design shape 302 is shown. To generate this 2-dimensional design shape, a surface feature 304, in the shape of a square, and a surface feature 306, in the shape of a rectangle, are provided in a staggered configuration. In this example, the top ends of the surface feature 304 and surface feature 306 may be aligned at point P5 along the X-axis. The surface features may be processed using ions 112, in a reactive ambient, according to the techniques generally described above, resulting in a final surface feature 310, having the shape of the design shape 302.

Figure 4:
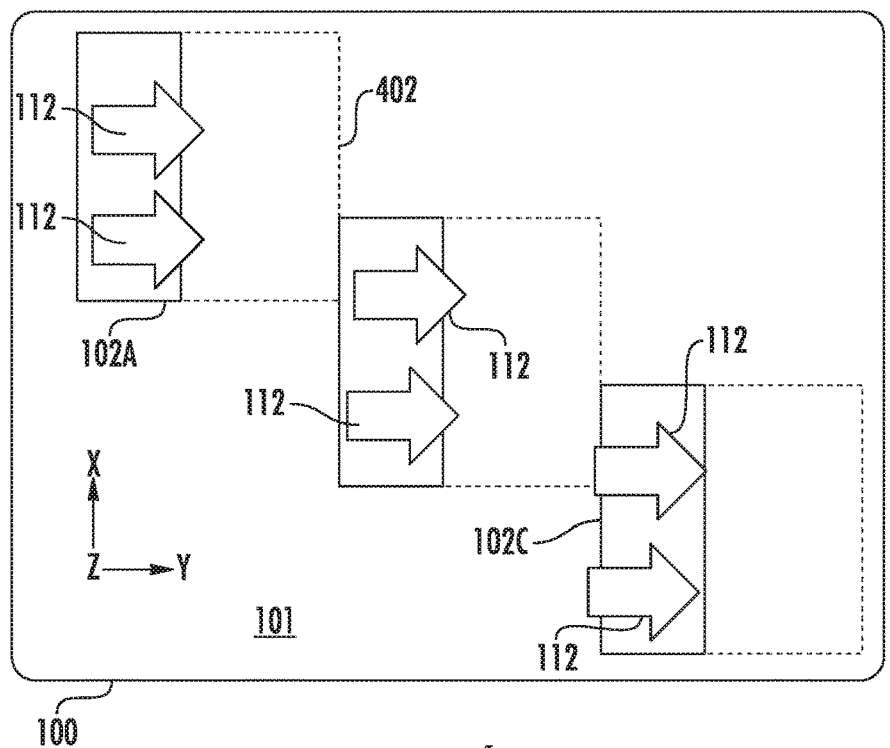
FIG. 4 illustrates an example for generating a complex surface feature according to additional embodiments of the disclosure.

In still further embodiments, three or more isolated surface features may be processed according to the techniques described hereinabove to generate a final, complex 2-D structure. FIG. 4 illustrates an example where three isolated surface features, shown as surface feature 102A, surface feature 102B, and surface feature 102C are generated in a substrate 100, offset from one another along the X-axis, and etched along the Y-axis using ions 112 to generate a staircase shape, shown as surface feature 402.

Figure 5:
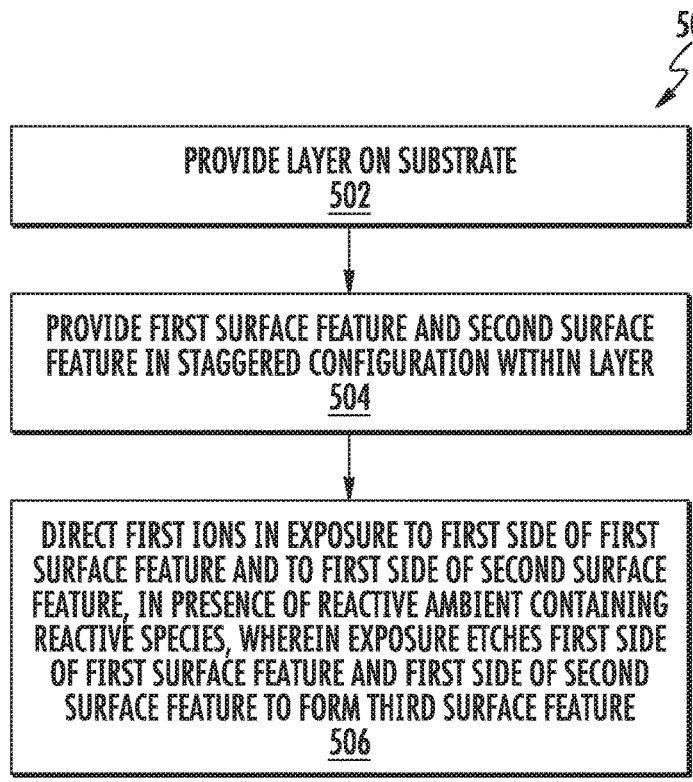
FIG. 5 illustrates a process flow according to additional embodiments of the disclosure.

FIG. 5 illustrates a process flow 500 according to additional embodiments of the disclosure. At block 502, a layer is provided on a substrate. In some embodiments the layer may be a known SiOC (silicon-oxygen-carbon) material or known SiON (silicon-oxygen-nitrogen) material, a silicon material, including amorphous silicon, a known oxide such as a TEOS (tetraethyl orthosilicate) oxide, or other material. Moreover, a first material of an underlying layer of the substrate may be a different material than a second material of the layer. In non-limiting examples, the material of the substrate may be a known silicon oxide, silicon nitride, titanium nitride, silicon, or other material.

At block 504 a first surface feature and a second surface feature may be provided in a staggered configuration within the layer. An example of a staggered configuration is where at least one end of the first surface feature is offset along a first axis, with respect to at least one end of the second surface feature. At block 506 first ions are directed in an exposure to a first side of the first surface feature and a first side of the second surface feature, in the presence of a ambient containing a reactive species. The exposure may have appropriate duration wherein the exposure etches the first side of the first surface feature and the second surface feature so the first surface feature and the second surface feature merge to form a third surface feature.

The present embodiments provide various advantages over conventional processing to define complex 2-dimensional features in a substrate. One advantage lies in the ability to increase a width of a plurality of recessed features while not increasing the length. This advantage leads to the related advantage of being able to form a complex feature by merging two formerly isolated features using a directional etch process to selectively increase the size of the features along just one direction. Another advantage is the ability to form a complex 2-dimensional shape within a substrate layer, enabling the faithful generation of a target shape for structures such as complex interconnect structures at sub 50 nm dimensions.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are in the tended to fall within the scope of the present disclosure. Furthermore, the present disclosure has been described herein in the context of a particular implementation in a particular environment for a particular purpose, while those of ordinary skill in the art will recognize the usefulness is not limited thereto and the present disclosure may be beneficially implemented in any number of environments for any number of purposes. Thus, the claims set forth below are to be construed in view of the full breadth and spirit of the present disclosure as described herein.

What is claimed is:

1. A method of patterning a substrate, comprising:
providing a first surface feature and a second surface feature in a staggered configuration within a layer, the layer being disposed on the substrate; and
directing first ions in a first exposure to a first side of the first surface feature and a first side of the second surface feature, in a presence of a reactive ambient containing a reactive species,
wherein the first exposure etches the first side of the first surface feature and the first side of the second surface feature, wherein after the directing, the first surface feature and the second surface feature merge to form a third surface feature.

2. The method of claim 1, wherein the third surface feature has a shape characterized by one of: an L-shape, a capital T-shape, a small t-shape, a zig-zag shape, and a staircase shape.

3. The method of claim 1, wherein the third surface feature is a recess within the layer.

4. The method of claim 1, wherein the substrate comprises a first material, and wherein the layer comprises a second material, wherein the ions and the reactive species selectively etch the second material of the layer with respect to the first material of the substrate, wherein a first etch rate of the first material is greater than a second etch rate of the second material.

5. The method of claim 1, wherein the substrate comprises a substrate plane, the method further comprising;
rotating the substrate through 180 degrees about a perpendicular to the substrate plane; and
directing second ions in a second exposure to a second side of the first surface feature and a second side of the second surface feature, in a presence of the reactive ambient containing the reactive species,
wherein a combination of the first exposure and the second exposure forms the third surface feature.

6. The method of claim 1, wherein the substrate comprises a substrate plane, wherein at least one end of the first surface feature is offset along a first axis, with respect to at least one end of the second surface feature.

7. The method of claim 6, wherein the substrate comprises a substrate plane, wherein the first side of the first surface feature and the first side of the second surface feature extend parallel to the first axis.

8. The method of claim 7, wherein the first ions form a first ribbon beam, the first ions having a long axis parallel to the first axis.

9. The method of claim 4, wherein the first ions comprise an ion trajectory, wherein a projection of the ion trajectory within the substrate plane is parallel to a second axis within the substrate plane, the second axis being perpendicular to the first axis.

10. The method of claim 9, wherein the ion trajectory forms a non-zero angle of incidence with respect to a perpendicular to the substrate plane.

11. The method of claim 10, wherein the non-zero angle of incidence is between 15 degrees and 75 degrees.

12. A method of patterning a layer disposed on a substrate, comprising:
providing a first surface feature and a second surface feature within the layer in a staggered configuration; and
subjecting the first surface feature and the second surface feature to an exposure, the exposure comprising:
directing, in a presence of a reactive ambient containing a reactive species, first ions to a first side of the first surface feature and to a first side of the second surface feature; and
concurrently directing second ions to a second side of the first surface feature and to a second side of the second surface feature,
wherein the exposure etches the first side of the first surface feature and the first side of the second surface feature, and etches the second side of the first surface feature and the second side of the second surface feature,
wherein after the directing, the first surface feature and the second surface feature merge to form a third surface feature.

13. The method of claim 12, wherein the substrate comprises a substrate plane, wherein at least one end of the first surface feature is offset along a first axis, with respect to at least one end of the second surface feature.

14. The method of claim 13, wherein the substrate comprises a substrate plane, wherein the first side and the second side of the first surface feature and the first side and the second side of the second surface feature extend parallel to the first axis.

15. The method of claim 13, wherein the first ions form a first ribbon beam and the second ions form a second ribbon beam, the first ions and the second ions having a long axis parallel to the first axis.

16. The method of claim 15, further comprising scanning the substrate along a second axis during the exposure, the second axis extending perpendicularly to the first axis.

17. A method of forming a device structure, comprising:

providing a first surface feature and a second surface feature in a staggered configuration within a first layer, the first layer being disposed on a substrate;

directing first ions in an exposure to a first side of the first surface feature and to a first side of the second surface feature, in a presence of a reactive ambient containing a reactive species, wherein the exposure etches the first side of the first surface feature and the second surface feature, wherein after the directing, the first surface feature and the second surface feature merge to form a third surface feature, the third feature comprising a recess; and filling the third surface feature with a conductive material.

18. The method of claim 17, wherein the substrate comprises a substrate plane, wherein at least one end of the first surface feature is offset along a first axis, with respect to at least one end of the second surface feature.

19. The method of claim 18, further comprising: forming a first metal line and a second metal line in a second layer, the second layer being disposed over the first layer, wherein the first metal line is offset with respect to the second metal line along the first axis and along a second axis, the second axis extending perpendicularly to the first axis, and wherein the third surface feature overlaps the first metal line and the second metal line.

* * * * *